US012586639B2

(12) United States Patent
Conte et al.

(10) Patent No.: US 12,586,639 B2
(45) Date of Patent: Mar. 24, 2026

(54) SENSE AMPLIFIER CIRCUIT, CORRESPONDING MEMORY DEVICE AND METHOD OF OPERATION

(71) Applicant: STMicroelectronics International N.V., Geneva (CH)

(72) Inventors: Antonino Conte, Tremestrieri Etneo (IT); Francesco La Rosa, Rousset (FR)

(73) Assignee: STMicroelectronics International N.V., Geneva (CH)

( * ) Notice: Subject to any disclaimer, the term of this patent is extended or adjusted under 35 U.S.C. 154(b) by 106 days.

(21) Appl. No.: 18/676,719

(22) Filed: May 29, 2024

(65) Prior Publication Data

US 2024/0404596 A1     Dec. 5, 2024

(30) Foreign Application Priority Data

May 31, 2023     (IT) ........................ 102023000011031

(51) Int. Cl.
G11C 13/00          (2006.01)

(52) U.S. Cl.
CPC ........ G11C 13/004 (2013.01); G11C 13/0004 (2013.01)

(58) Field of Classification Search
CPC .............. G11C 13/004; G11C 13/0004; G11C 14/0045
See application file for complete search history.

(56) References Cited

U.S. PATENT DOCUMENTS

| | | | |
|---|---|---|---|
| 4,733,373 A | 3/1988 | Murotani | |
| 5,297,097 A | 3/1994 | Etoh et al. | |
| 5,777,934 A | 7/1998 | Lee et al. | |
| 6,373,753 B1 | 4/2002 | Proebsting | |
| 7,379,340 B2 | 5/2008 | Hosono et al. | |
| 7,894,241 B2 | 2/2011 | Lee et al. | |
| 9,542,995 B2 | 1/2017 | Sachdev et al. | |
| 2011/0063915 A1 | 3/2011 | Tanaka et al. | |
| 2014/0071747 A1* | 3/2014 | Jurasek | G11C 13/0069 365/163 |
| 2019/0066805 A1 | 2/2019 | Tran et al. | |

(Continued)

OTHER PUBLICATIONS

IT Search Report and Written Opinion for priority application, IT Appl. No. 102023000011031, report dated Jan. 19, 2024, 6 pgs.

*Primary Examiner* — Han Yang
(74) *Attorney, Agent, or Firm* — Crowe & Dunlevy LLC

(57)          ABSTRACT
First, second input terminals of a sense amplifier are coupled to first, second memory sensing nodes. A first input transistor has a channel arranged between a first comparator input and a first comparator output, and a control terminal at a bias node. A second input transistor has a channel arranged between a second comparator input and a second comparator output, and a control terminal at a bias node. The first and second comparator inputs are selectively couplable to each other, in response to compensation signal assertion, or to the first and second input terminals, in response to compensation signal de-assertion. The bias node is selectively couplable to a comparator biasing node in response to bias enable assertion, or is floating in response to the bias enable de-assertion. A sensing circuit produces a read signal as a function of a difference between first, second currents at the comparator outputs.

17 Claims, 8 Drawing Sheets

(56) References Cited

U.S. PATENT DOCUMENTS

| | | | |
|---|---|---|---|
| 2019/0108886 A1 | 4/2019 | Paolino et al. | |
| 2020/0168266 A1 | 5/2020 | Yamazaki et al. | |
| 2021/0312968 A1 | 10/2021 | Vimercati | |
| 2022/0343960 A1* | 10/2022 | Guo | G11C 29/025 |

* cited by examiner

SENSE AMPLIFIER CIRCUIT, CORRESPONDING MEMORY DEVICE AND METHOD OF OPERATION

PRIORITY CLAIM

This application claims the priority benefit of Italian Application for Patent No. 102023000011031 filed on May 31, 2023, the content of which is hereby incorporated by reference in its entirety to the maximum extent allowable by law.

TECHNICAL FIELD

The description relates to circuits and methods for amplifying the differential voltage sensed at the bit lines of a memory device via a sense amplifier circuit.

Such sense amplifiers may be used, for instance, during read operation from non-volatile memories (NVM) such as embedded phase-change memories (embedded PCM or ePCM). Such memories may be applied, for instance, to general-purpose microcontrollers (GP MCU) and secure microcontrollers.

BACKGROUND

Read operations (e.g., fetching of data) from phase-change memories are used to output (e.g., fetch, extract) the content of PCM data words on an output data bus (e.g., a 145-bit bus DATA_OUT[144:0]).

FIG. 1 is a (simplified) circuit diagram exemplary of a reading architecture in a PCM memory, and FIG. 2 is a time diagram including waveforms of signals during a read operation in the architecture of FIG. 1. As exemplified in FIG. 1, a memory 10 includes an array of memory cells 102 (e.g., phase-change memory (PCM) cells) arranged in bit lines 103B (here illustrated as vertical lines) and word lines $103W_1$, $103W_2$, $103W_3$ (here illustrated as horizontal lines, also collectively or individually referred to as word lines 103W) according to a memory architecture known per se. In particular, each memory cell 102 may be arranged in series to a respective selection transistor 104 (e.g., a pnp BJT transistor) between a ground voltage terminal and the respective bit line 103B. The selection transistors 104 of the same word line 103W receive the same control signal at their control (e.g., base) terminals, e.g., control signals WL1, WL2, WL3 as exemplified in FIGS. 1 and 2. Each bit line 103B may be selectively coupled (e.g., via a respective p-channel MOS transistor 106 having its current path in series to the bit line and receiving a control signal Y_SEL) to a memory supply voltage rail 108 that provides a regulated voltage $V_{REG}$ (e.g., having a target voltage value $V_{BL\_CHARGE}$). Additionally, respective clamping transistors 110 (e.g., pnp BJT transistors) may be coupled between each bit line 103B (e.g., at the source terminals of transistors 106) and the ground terminal. The clamping transistors 110 may receive the same control signal $WL_{CLAMP}$ at their control (e.g., base) terminals. Each bit line 103B has a respective capacitive load CBL due to the capacitances of the memory cells 102 and/or of the transistors 106, 110.

As anticipated, a read operation in a phase-change memory as exemplified in FIG. 1 may be carried out as exemplified in FIG. 2 to read (and provide as output) the content of plural PCM words on an output data bus DATA_OUT[144:0]. Generally, in a phase-change memory, information may be stored associating two cells to each bit (datum): a SET cell (having low resistance and high current)

and a RESET cell (having high resistance and low current). A memory sense circuit may read information from the cells in differential mode.

In order to provide fast reading of the memory cells, the specification for the memory access time ($T_{ACC}$) may be particularly demanding (e.g., in the order of 10 ns). Additionally, read parallelism (e.g., reading two words in parallel) may be used to increase the throughput of the output data. As stated previously, sensing of the content of the memory cells may be carried out in differential mode: a sensing circuit reads in differential mode from the bit line BL_SET and the bit line BL_RESET, so that the SET memory cell and the RESET memory cell are selected. The SET memory cell and the RESET memory cell are selected by properly driving the control signals (word selection signals) WL1, WL2, WL3: for instance, as exemplified in FIG. 2, by keeping signals WL1 and WL3 at a high logic value (e.g., equal to value $V_{BL\_CHARGE}$) and by driving signal WL2 to a low logic value (e.g., equal to the ground voltage, 0 V), cell $102_S$ is selected as the SET cell and cell $102_R$ is selected as the RESET cell.

A voltage regulator (e.g., a low-dropout, LDO, regulator) produces the regulated voltage $V_{REG}$ at the supply rail 108 (e.g., having a target voltage value $V_{BL\_CHARGE}$). The value $V_{BL\_CHARGE}$ of voltage $V_{REG}$ should be high enough to provide a proper voltage stack to the bit lines to result in the correct values of the memory cells currents. Before sensing (e.g., differentially between BL_SET and BL_RESET), the voltage $V_{BL}$ at the selected bit lines is clamped to the value $V_{BE}$ of the base-emitter voltage of the clamping transistors 110, and then the bit lines are pre-charged to the value $V_{BL\_CHARGE}$ by the regulated voltage $V_{REG}$ by activating the transistors 106 (see in FIG. 2 the control signal $WL_{CLAMP}$ switching from a low value to a high value $V_{BL\_CHARGE}$ to switch off transistors 110 and the control signal Y_SEL switching from a high value $V_{BL\_CHARGE}$ to a low value to switch on transistors 106). The control signals WL1 and WL3 of the unselected word lines are kept at a high voltage value (e.g., $V_{BL\_CHARGE}$) so as to keep the respective selection transistors in a non-conductive state.

Embedded phase-change memories with BJT selectors as exemplified herein may thus rely on the bit lines being biased (e.g., pre-charged) to a target voltage level $V_{BL\_CHARGE}$ higher than the minimum internal supply voltage ($V_{DD}$) and the external supply voltage ($V_{CC}$). However, the sense amplifier (SA) cannot be supplied to operate above the bit line voltage $V_{BL\_CHARGE}$, otherwise it would require a boosted supply voltage (e.g., produced by a charge pump circuit) resulting in higher power consumption during reading operation. Additionally, the reading operation has to obtain the sensing information from a shifted voltage domain, with the sense amplifier operating at voltage $V_{DD}$ while the bit line is biased at a higher voltage $V_{BL\_CHARGE}$. The shifted method known in the art obtains the bit line voltage $V_{BL\_CHARGE}$ from input capacitors, but this known approach has some limitations that limit the reading speed of the sense amplifier versus its accuracy. For example, a long discharge window (e.g., of about 4 ns) may be required to register differences in input capacitors; the input capacitors are shorted and in parallel to the sense amplifier core during commutation, possibly affecting the switching speed; and the input capacitors may slow down the offset compensation mechanism (e.g., because a long equalization time is needed).

Therefore, there is a need in the art to provide improved reading architectures for phase-change memories, in particular providing improved sense amplifiers that allow differential voltage sensing without relying on input capacitors.

There is a need in the art to contribute in providing such improved sense amplifiers for phase-change memories.

SUMMARY

One or more embodiments may relate to a sense amplifier circuit.

One or more embodiments may relate to a corresponding memory device.

One or more embodiments may relate to a corresponding method of operation (e.g., a memory reading method).

In an embodiment, a sense amplifier circuit includes a first input terminal and a second input terminal configured for coupling to a first memory sensing node and a second memory sensing node, respectively. The sense amplifier includes a comparator circuit, which in turn includes a first input node and a second input node, as well as a first output node and a second output node that are configured to produce a first output current and a second output current, respectively. The comparator includes a first input transistor having a conductive channel arranged between the first comparator input node and the first comparator output node and a control terminal coupled to an internal biasing node, as well as a second input transistor having a conductive channel arranged between the second comparator input node and the second comparator output node and a control terminal coupled to the internal biasing node. The first comparator input node and the second comparator input node are selectively couplable either to each other, in response to a compensation signal being asserted, or to the first and second input terminals, respectively, in response to the compensation signal being de-asserted. The internal biasing node is selectively couplable to a comparator biasing node in response to a bias enable signal being asserted, or is floating in response to the bias enable signal being de-asserted. The sense amplifier further includes a sensing circuit coupled to the first comparator output node and the second comparator output node, and configured to produce a memory reading signal as a function of a difference between the first output current and the second output current.

One or more embodiments may thus provide a sense amplifier for a memory device which does not include input capacitors, which may improve the memory access time and/or reduce power consumption.

According to another aspect, a memory device includes a plurality of memory banks. Each memory bank is coupled to a respective sense amplifier circuit as described above. Each memory bank includes an array of memory cells arranged in a plurality of bit lines and a plurality of word lines. Each memory cell is arranged in series to a respective selection transistor between a ground terminal and the corresponding bit line, and each bit line is selectively couplable to a regulated supply node that provides a regulated supply voltage or to one of the first and second memory sensing nodes.

According to another aspect, a method of operating a memory device includes: i) asserting the bias enable signal to couple the internal biasing node of the comparator circuit to the comparator biasing node, and asserting the compensation signal to couple the first comparator input node and the second comparator input node to each other; ii) coupling at least one pair of selected bit lines to the regulated supply node to pre-charge the selected bit lines to a target voltage; iii) upon expiration of the pre-charge of the pair of selected bit lines: decoupling the pair of selected bit lines from the regulated supply node; coupling the pair of selected bit lines to the first and second memory sensing nodes, respectively; de-asserting the bias enable signal to make the internal biasing node of the comparator circuit float (e.g., isolate it from the comparator biasing node); enabling and equalizing the sensing circuit; v) upon expiration of an equalization interval, de-asserting the compensation signal to couple the first comparator input node and the second comparator input node to the first input terminal and to the second input terminal, respectively, and activating the sensing circuit; and vi) upon expiration of a sensing interval, producing the memory reading signal.

BRIEF DESCRIPTION OF THE DRAWINGS

One or more embodiments will now be described, by way of example, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

Figure 1:
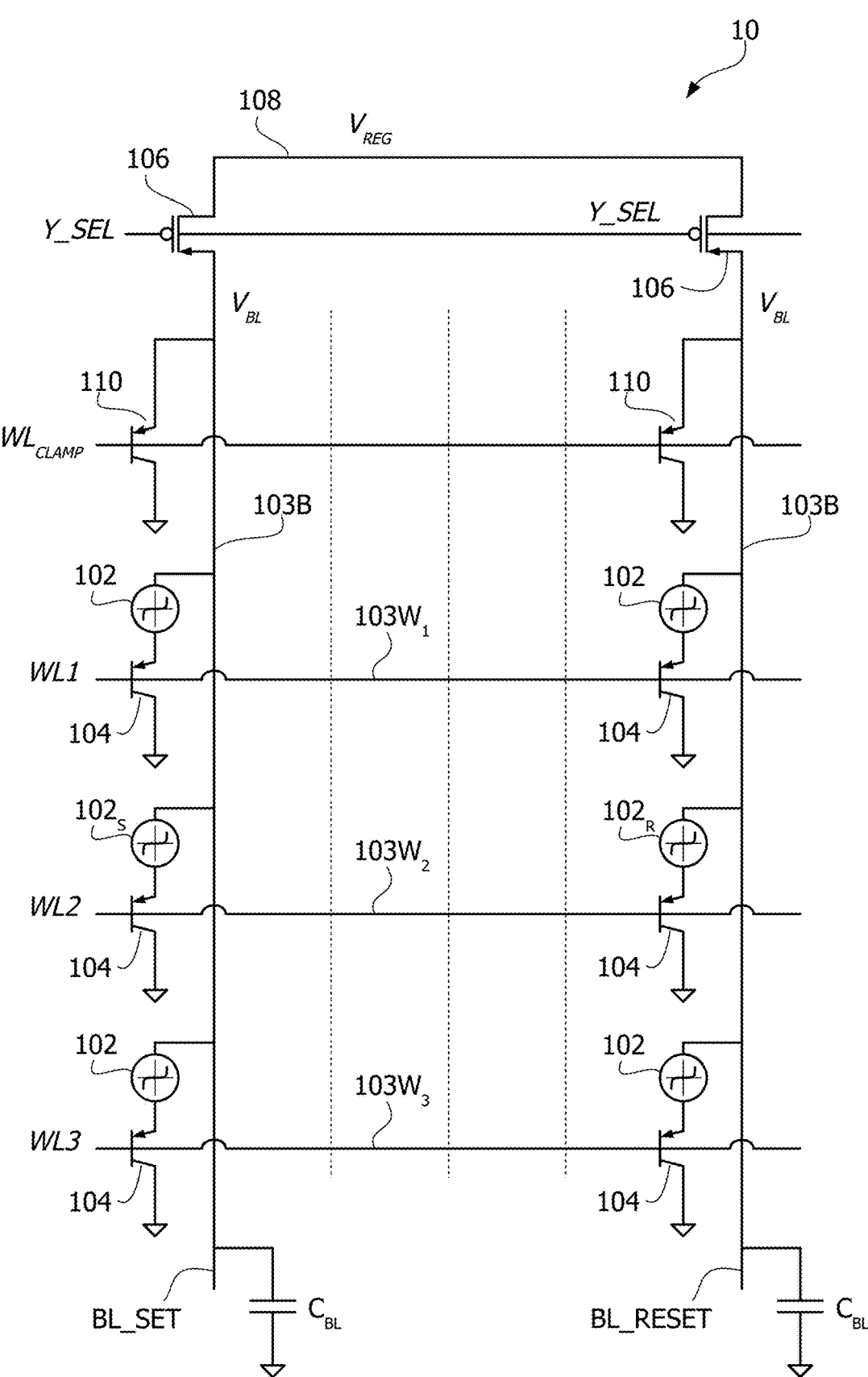
FIG. 1, previously presented, is a simplified circuit diagram exemplary of a reading architecture in a PCM memory.
Figure 2:
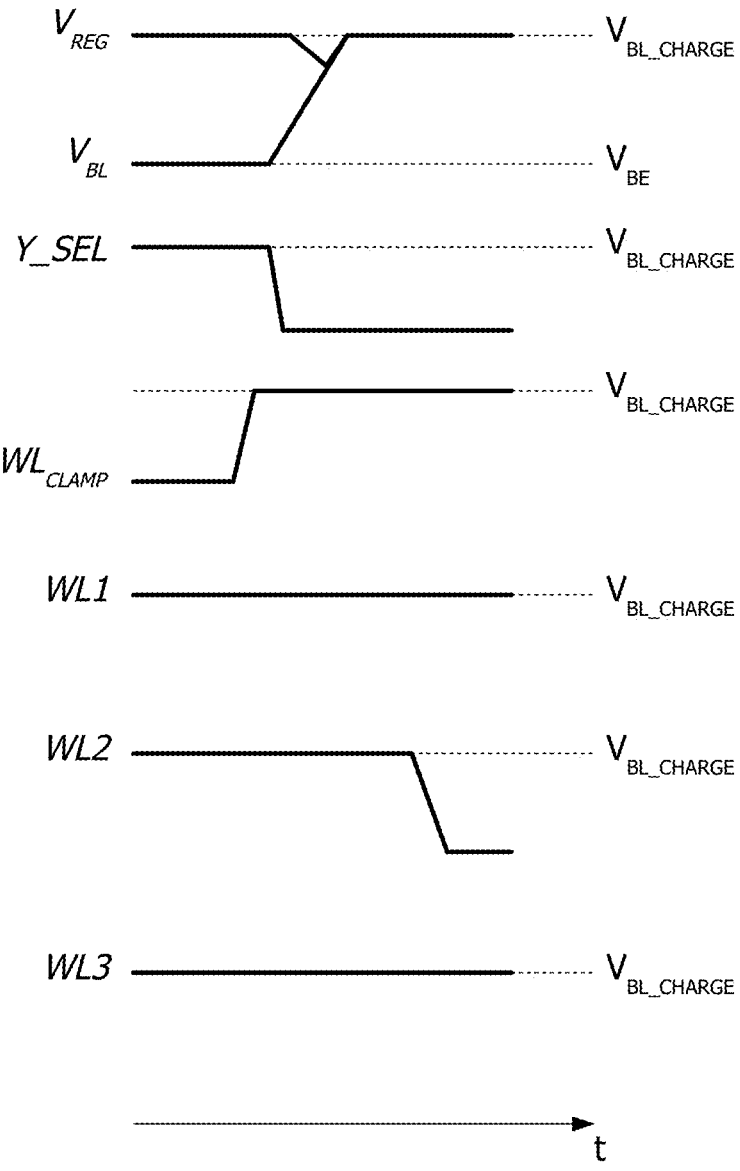
FIG. 2, previously presented, is a time diagram including waveforms of signals during a read operation in the architecture of FIG. 1.
Figure 3:
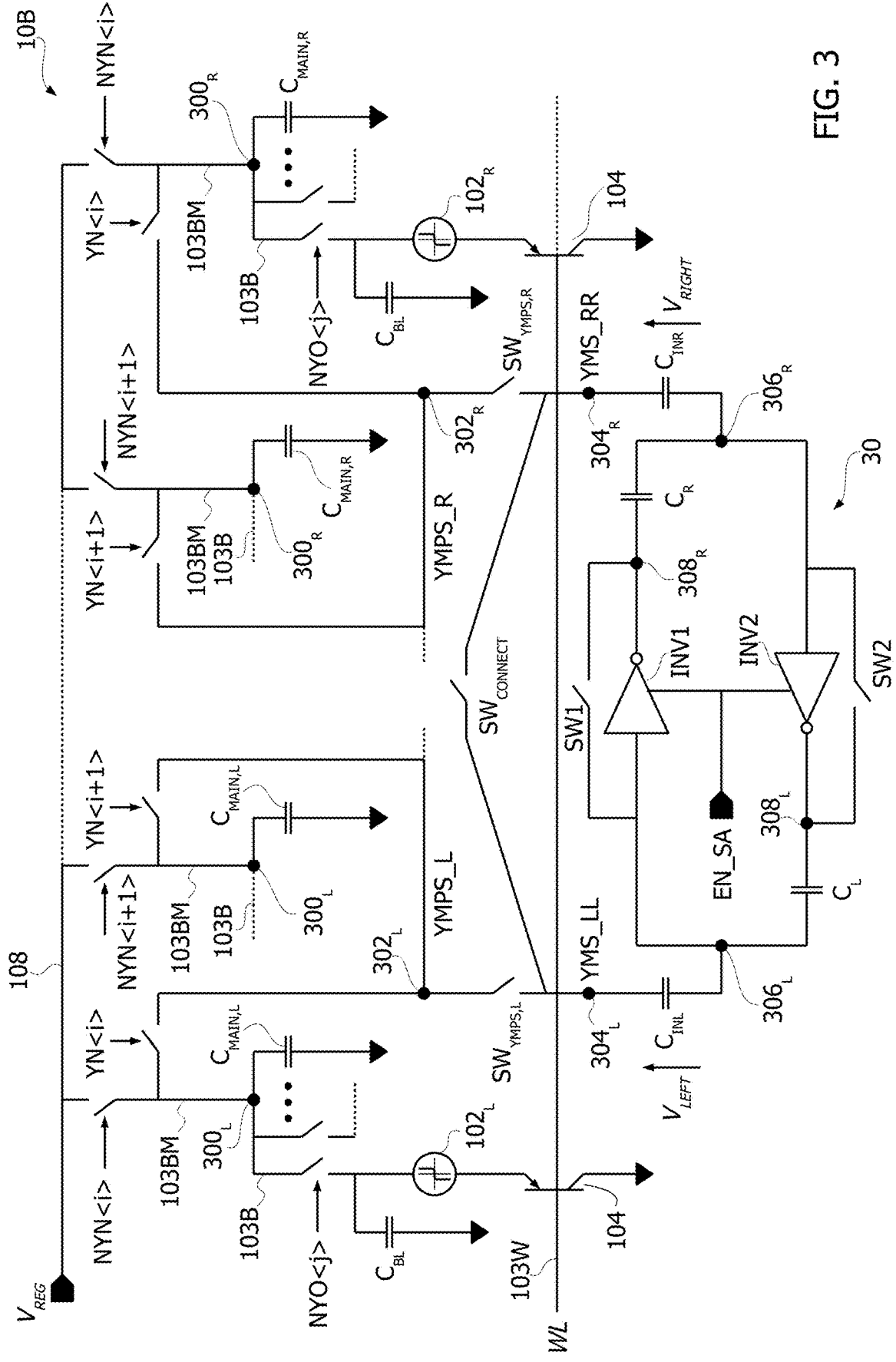
FIG. 3 is a circuit diagram exemplary of a reading architecture in a PCM memory.

By way of introduction to the detailed description of exemplary embodiments, reference may first be made to FIG. 3, which is a circuit diagram exemplary of a reading architecture of a PCM memory bank 10B. It will be noted that for ease of illustration, a single word line 103W is illustrated in FIG. 3, and plural bit lines 103B. It will also be noted that certain elements of the array of the memory bank 10B are illustrated only once for ease of illustration as well. The bit lines are arranged in two main groups (e.g., a left group and a right group), with the two main groups including the same number of bit lines (e.g., 16 bit lines), in order to allow differential reading. During read operations, a differential voltage is sensed between two bit lines (a SET line and a RESET line), one belonging to the left group and the other belonging to the right group. The two main groups are each subdivided in a number n of subgroups or "main bit lines" 103BM, e.g., 2 subgroups, each subgroup including a number m of bit lines, e.g., 8 bit lines. Each main bit line has an associated parasitic capacitance $C_{MAIN}$ (e.g., $C_{MAIN,L}$ for the main bit lines in the left group and $C_{MAIN,R}$ for the main bit lines in the right group). The bit lines 103B of the same main bit line 103BM are arranged in parallel between a respective common node 300 (e.g., nodes 300$_L$ for the main bit lines in the left group and nodes 300$_R$ for the main bit lines in the right group) and ground, and are selectively couplable to the common node 300 via respective switches arranged in series to the bit lines. These switches are controlled by respective selection signals NYO (e.g., NYO<j>, . . . , with j=1, . . . , m). Each common node 300 (e.g., each main bit line) is selectively couplable via respective switches either to the supply voltage rail 108 at voltage $V_{REG}$ or to a respective sensing node 302 (e.g., a left sensing node 302$_L$ for the main bit lines of the left group and a right sensing node 302$_R$ for the main bit lines of the right group). In particular, a first main bit line in the left group and a first main bit line in the right group can be coupled to rail 108 depending on the value of signal NYN<i>, a second main bit line in the left group and a second main bit line in the right group can be coupled to rail 108 depending on the value of signal NYN<i+1>, and so on (with i=1, . . . , n). In a similar way, two main bit lines at a time (one from the left group and the other from the right group) can be coupled to the respective sensing nodes 302$_L$ and 302$_R$ depending on the values of respective signals YN<i>, YN<i+1>, . . . (with i=1, . . . , n). The sense amplifier core 30 (e.g., a latch-type sense amplifier) includes differential input nodes 304$_L$ and 304$_R$. Node 304$_L$ is selectively couplable to node 302$_L$ via a switch $SW_{YMPS,L}$, and node 304$_R$ is selectively couplable to node 302$_R$ via a switch $SW_{YMPS,R}$. In particular, switches $SW_{YMPS,L}$ and $SW_{YMPS,R}$ are configured to isolate nodes 304$_L$ and 304$_R$ from nodes 302$_L$ and 302$_R$ since the latter nodes may assume high voltage values during write operations. Nodes 304$_L$ and 304$_L$ are selectively couplable to each other via a switch $SW_{CONNECT}$. A first input capacitor $C_{INL}$ of the sense amplifier 30 has a first terminal coupled to node 304$_L$ and a second terminal coupled to a node 306$_L$, and a second input capacitor $C_{INR}$ of the sense amplifier 30 has a first terminal coupled to node 304$_R$ and a second terminal coupled to a node 306$_R$. The sense amplifier core 30 further includes: a first inverter INV1 having an input terminal coupled to node 306$_L$ and an output terminal coupled to a node 308$_R$, a first capacitor $C_R$ coupled between nodes 308$_R$ and 306$_R$, a first switch SW1 that bypasses inverter INV1 (e.g., coupled between the input and output terminals of inverter INV1), a second inverter INV2 having an input terminal coupled to node 306$_R$ and an output terminal coupled to a node 308$_L$, a second capacitor $C_L$ coupled between nodes 308$_L$ and 306$_L$, and a second switch SW2 that bypasses inverter INV2 (e.g., coupled between the input and output terminals of inverter INV2). Inverters INV1 and INV2 are enabled by an enable signal EN_SA, and are supplied at a voltage $V_{DD}$ normally lower than the regulated voltage $V_{REG}$ (not visible in FIG. 3 for ease of illustration). Switches SW1 and SW2 may be controlled by the same equalization signal EQ (not visible in FIG. 3 for ease of illustration).

Read operation in a memory bank 10B as exemplified in FIG. 3 may be carried out according to the procedure described in the following.

In a first step, the main bit lines (e.g., all nodes 300$_L$ and 300$_R$) are connected to the supply voltage rail 108 and charged by voltage $V_{REG}$ to the target value $V_{BL\_CHARGE}$ (e.g., about 1.7 V). The word line signal WL applied to the word line 103W is also driven to the value $V_{BL\_CHARGE}$. Additionally, signals YN<i>, YN<i+1>, . . . are set so as to connect one of nodes 300$_L$ of the left group and the corresponding (e.g., homologous, symmetrical) node 300$_R$ of the right group to the sensing nodes 302$_L$ and 302$_R$, respectively, thereby selecting the main bit lines for reading. Additionally, sensing node 302$_L$ is connected to the input node 304$_L$ of the sense amplifier core 30 by closing switch $SW_{YMPS,L}$, and sensing node 302$_R$ is connected to the input node 304$_R$ of the sense amplifier core 30 by closing switch $SW_{YMPS,R}$. The remaining switches are open during the first step, that is: all nodes 300 that do not correspond to a selected main bit line are decoupled from the respective sensing node 302, all the bit lines are decoupled from the respective node 300 (at this stage), and switches $SW_{CONNECT}$, SW1 and SW2 of the sense amplifier core 30 are open as well. The enable signal EN_SA is set at a value that switches off the inverters INV1 and INV2, i.e., it is de-asserted (e.g., set to a low logic value, ground voltage, 0 V).

In a second step, switches SW1 and SW2 are closed (e.g., equalization signal EQ is asserted) and enable signal EN_SA is asserted (e.g., set to a high logic value) so as to activate inverters INV1 and INV2. In this step, input offset of the sense amplifier core 30 is compensated and the input capacitors $C_{INL}$, $C_{INR}$ are pre-charged.

In a third step, a selected bit line pertaining to the left group and to the selected main bit line (i.e., the left main bit line that is currently connected to node 302$_L$) is connected to the corresponding main bit line (e.g., node 300$_L$) by closing the respective switch via signal NYO<j>. Similarly, the corresponding selected bit line pertaining to the right group and to the selected main bit line (i.e., the right main bit line that is currently connected to node 302$_R$) is connected to the corresponding main bit line (e.g., node 300$_R$) by closing the respective switch via signal NYO<j>. By doing so, the selected bit lines are pre-charged, i.e., the respective capacitances CBL are charged from voltage $V_{BE}$ (e.g., about 0.6 V) to the target voltage $V_{BL\_CHARGE}$.

In a fourth step, the selected main bit lines (left and right) are disconnected from the supply voltage rail 108 by opening the respective switches controlled by signals NYN<i>.

In a fifth step, the word line signal WL applied to a certain word line 103W is driven to ground voltage, thereby activating the selection transistors 104 and carrying out the actual word line selection (i.e., selection of two specific memory cells 102$_L$ and 102$_R$). As a result, capacitive nodes 300$_L$ and 300$_R$ (e.g., the bit line capacitances CBL and the main bit line capacitances $C_{MAIN}$) start discharging and the voltage at nodes 300$_L$ and 300$_R$ (that are connected to the sensing nodes 302$_L$ and 302$_R$) drops during a so-called "discharge window". At the same time, capacitor C$_{INL}$ is charged to a certain voltage V$_{LEFT}$ and capacitor C$_{INR}$ is charged to a certain voltage V$_{RIGHT}$ depending on the resistance of the memory cells 102$_L$ and 102$_R$.

In a sixth step, switches SW$_{YMPS,L}$ and SW$_{YMPS,R}$ are opened to disconnect the sense amplifier core 30 (whose input terminals have been charged) from the memory array. Switches SW1 and SW2 are opened as well, and switch SW$_{CONNECT}$ is closed. In this state, sensing of the differential voltage (e.g., difference between V$_{LEFT}$ and V$_{RIGHT}$) is carried out by the sense amplifier core 30.

A reading architecture as exemplified in FIG. 3 may thus rely on the provision of input capacitors C$_{INL}$ and C$_{INR}$ to shift the input voltages for the sense amplifier core 30. Also, the corresponding reading procedure described above may entail a discharge window having a non-negligible duration. Therefore, it is desirable to provide improved reading architectures (in particular, improved sense amplifiers) that do not include input capacitors and/or reduce the duration of the discharge phase.

Figure 4:
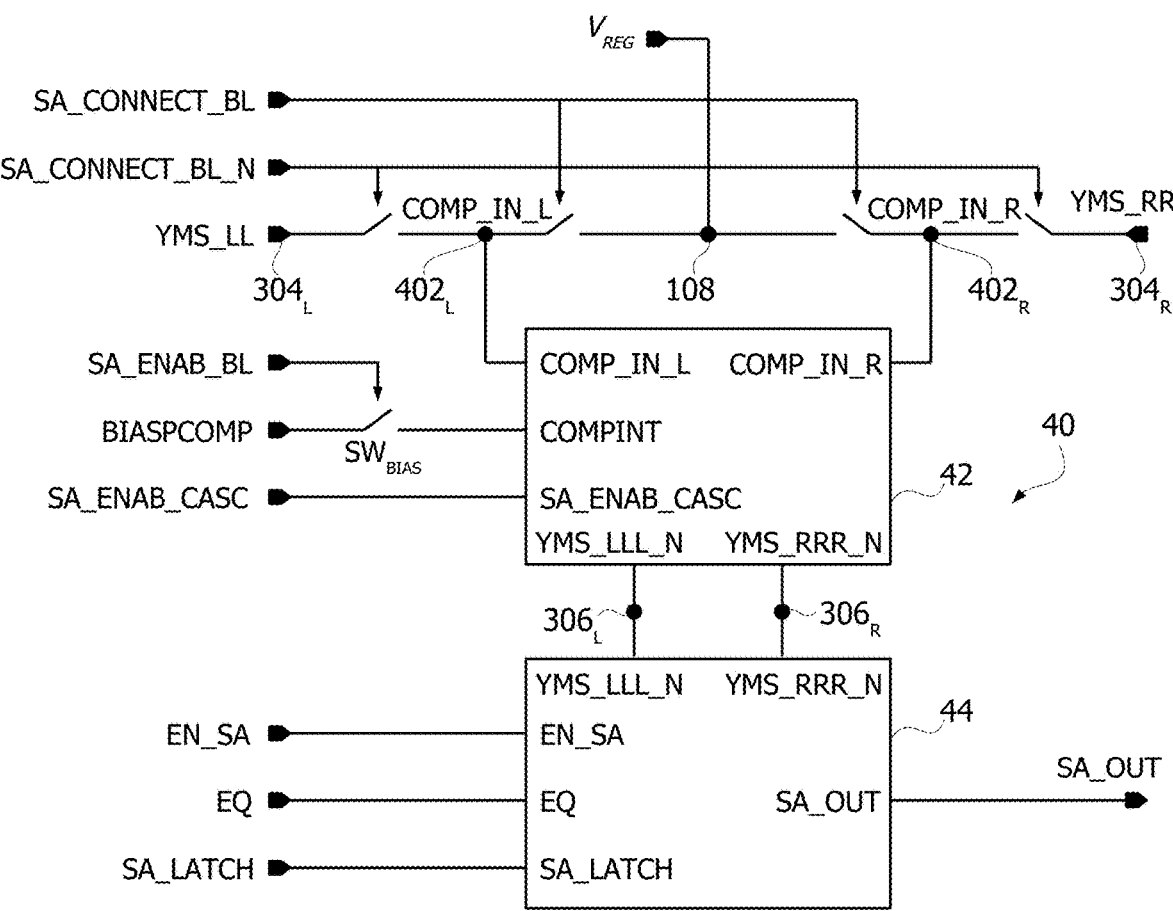
FIG. 4 is a circuit block diagram exemplary of a reading architecture.

One or more embodiments thus rely on an architecture as exemplified in FIG. 4, which is a circuit block diagram exemplary of a memory reading circuit that includes a sense amplifier 40 including a floating comparator 42 (e.g., dispensing with input capacitors) and a sense amplifier core (SA core) 44. Substantially, the floating comparator 42 has two input nodes 402$_L$ and 402$_R$ that receive respective input signals COMP_IN_L and COMP_IN_R. Node 402$_L$ may alternatively be coupled to node 304$_L$ to receive a first sensing signal YMS_LL (see FIG. 3 as well) from a selected (e.g., left) main bit line, or to the supply voltage rail 108 to receive the regulated voltage V$_{REG}$. Similarly, node 402$_R$ may alternatively be coupled to node 304$_R$ to receive a second sensing signal YMS_RR (see FIG. 3 as well) from a selected (e.g., right) main bit line, or to the supply voltage rail 108 to receive the regulated voltage V$_{REG}$. In particular, nodes 402$_L$ and 402$_R$ may be connected to each other (and in particular to node 108) via switches if an offset compensation signal SA_CONNECT_BL is asserted (e.g., asserted-low), and they may be connected respectively to nodes 304$_L$ and 304$_R$ via other switches if signal SA_CONNECT_BL is de-asserted, that is, if the complement signal SA_CONNECT_BL_N is asserted (e.g., asserted-low). These features are used for input offset compensation, as further discussed in the following. In addition, the floating comparator 42 receives a biasing voltage from a bias node BIASPCOMP, and a cascode enable signal SA_ENAB_CASC. Biasing of the floating comparator 42 is selectively enablable by a switch SW$_{BIAS}$ arranged between the biasing input COMP-INT and the bias node BIASPCOMP and controlled by a bias enable signal SA_ENAB_BL. The floating comparator 42 produces an amplified differential signal between its output nodes YMS_LLL_N and YMS_RRR_N, which are coupled to the input nodes 306$_L$ and 306$_R$ of the sense amplifier core 44. The sense amplifier core 44 receives the differential signal between nodes YMS_LLL_N and YMS_RRR_N, receives an enable signal EN_SA (similar to FIG. 3), an equalization signal EQ (similar to FIG. 3), a latch enable signal SA_LATCH, and produces an output (reading) signal SA_OUT.

Figure 5:
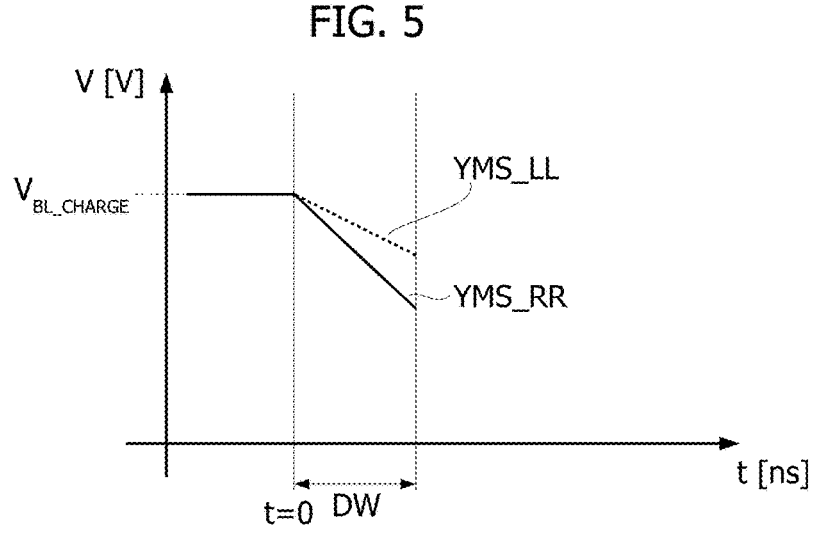
FIG. 5 is a time diagram including waveforms of signals during a read operation in the architecture of FIG. 4.

The floating comparator 42 provides amplification of the differential signal from nodes 304$_L$, 304$_R$ to the differential input of the SA core 44, and thus facilitates anticipation of sensing (e.g., shortening or contraction of the discharge window), as may be further understood by making reference to FIG. 5, which is a time diagram including waveforms of signals YMS_LL and YMS_RR during a read operation. As exemplified, signals YMS_LL and YMS_RR are initially both high (e.g., forced to value V$_{BL\_CHARGE}$ at about 1.7 V) due to the pre-charge phase. During the discharge window DW, signals YMS_LL and YMS_RR decrease at different rates due to the different resistance values of the corresponding memory cells and produce the input differential signal for the sense amplifier 40. The more anticipated (i.e., closer to the start of the discharge window DW, at time t=0) is the sensing instant, the smaller is the amplitude of the differential signal (i.e., the difference between signals YMS_LL and YMS_RR) input to the sense amplifier 40. Therefore, amplification of such a differential signal allows reducing the duration of the discharge window DW without affecting the reading capability.

Figure 6:
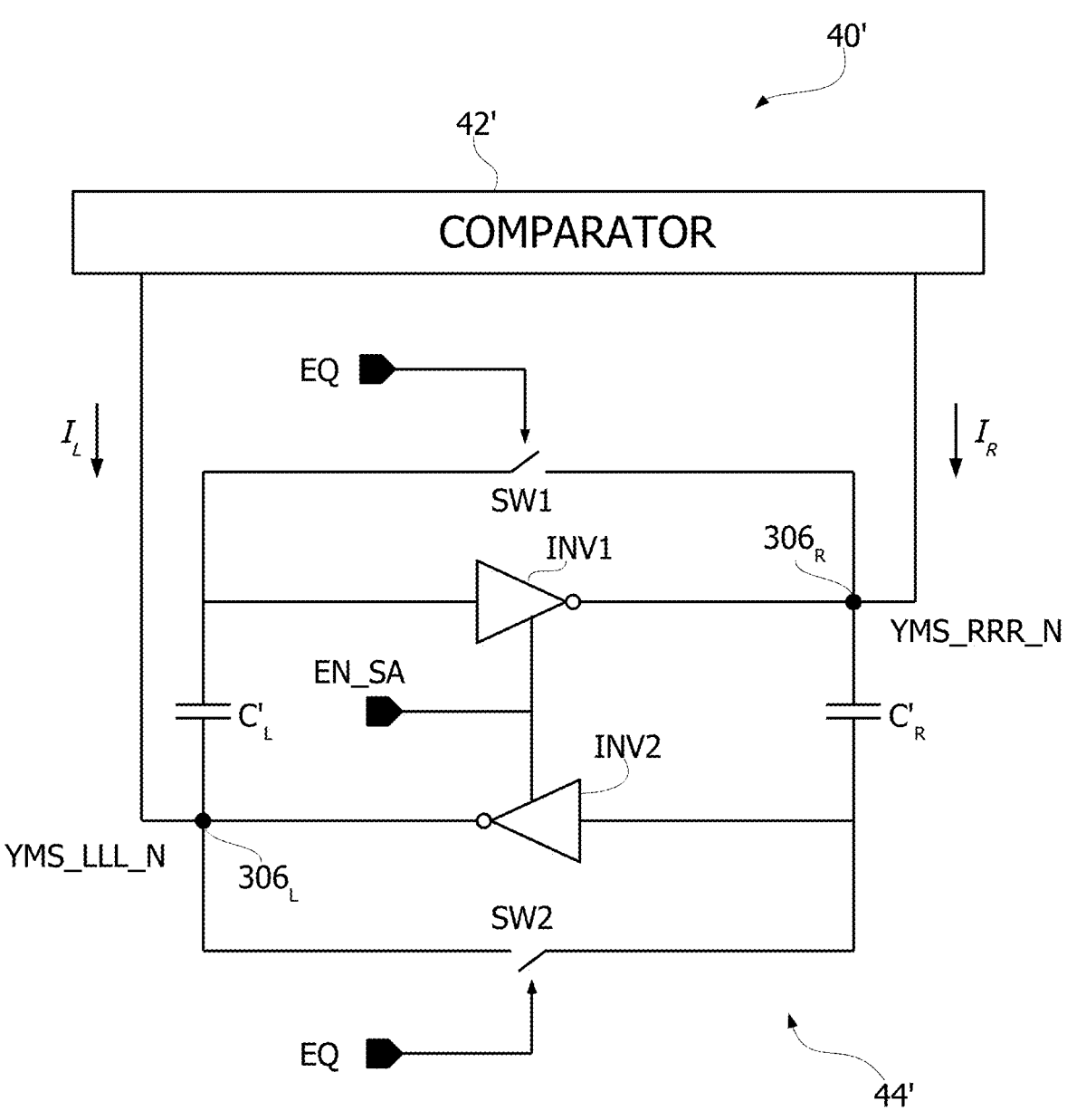
FIG. 6 is a circuit block diagram exemplary of a sense amplifier circuit for use in a memory device.

Additionally, the architecture of FIG. 4 facilitates solving common mode (CM) input voltage issues (e.g., the common mode voltage being higher than the supply voltage V$_{DD}$ of the SA core 44, the common mode voltage being variable in the range of V$_{BL\_CHARGE}$, and/or the common mode voltage being a function of the cell currents). An offset compensation mechanism (see the switches coupled to nodes 402$_L$, 402$_R$ in FIG. 4) is implemented to allow usage of small and fast devices in the implementation of the reading circuit, e.g., to avoid mismatch and obtain high accuracy. In this respect, FIG. 6 is a circuit block diagram of a sense amplifier circuit 40' that may be used as a reference to understand possible issues that may occur during reading due to offset compensation of the input to the SA core 44', whatever is the type of comparator 42'. Referring to FIG. 6, the following currents and voltages can be defined: I$_d$ is the differential current output by comparator 42', I$_{cm}$ is the common mode current, I$_L$ is the current flowing from the first output node of comparator 42' to the first input node 306$_L$ of the SA core 44', I$_R$ is the current flowing from the second output node of comparator 42' to the second input node 306$_R$ of the SA core 44', V$_{YMS\_LLL\_N}$ is the voltage at node 306$_L$ (e.g., between node 306$_L$ and ground), and V$_{YMS\_RRR\_N}$ is the voltage at node 306$_R$ (e.g., between node 306$_R$ and ground). The following definitions and equations (1) to (4) thus apply:

$$I_d(t) \triangleq I_L(t) - I_R(t) \tag{1}$$

$$I_{cm}(t) \triangleq \frac{I_L(t) + I_R(t)}{2} \tag{2}$$

$$I_L(t) = I_{cm}(t) + \frac{I_d(t)}{2} \tag{3}$$

$$I_R(t) = I_{cm}(t) - \frac{I_d(t)}{2} \tag{4}$$

Whatever the comparator 42' used, with offset compensation, a difference in biasing before and after equalization of the SA core 44' may be critical. At an initial instant t=0, offset compensation is carried out (i.e., signal EQ is asserted and switches SW1 and SW2 are closed) with a certain common mode current I$_{cm}$(0) (i.e., the current I$_{cm}$ at t=0) and a null differential current I$_d$(0)=0. At a subsequent instant t=t1 (with t1>0), when equalization is removed (i.e., signal EQ is de-asserted and switches SW1 and SW2 are opened), if I$_{cm}$(t1)≠I$_{cm}$(0) (that is, if the common mode current has changed meanwhile due to a change of the working point), the offset compensation may be compromised, that is, the following conditions may apply: V$_{YMS\_LLL\_N}$(0)≠ V$_{YMS\_LLL\_N}$(t1) and V$_{YMS\_RRR\_N}$(0)≠V$_{YMS\_RRR\_N}$(t1). Thus, a change of the working point of the SA core 44' resulting in I$_{cm}$(t1)≠I$_{cm}$(0) may cause a commutation of the SA core 44' at t=t1 even if I$_d$(t1)=0 (i.e., a false commutation). As further described in the following, one or more embodiments based on a floating comparator 42 may advantageously result in the compensation done at t=0 being valid also for subsequent instants.

Figure 7:
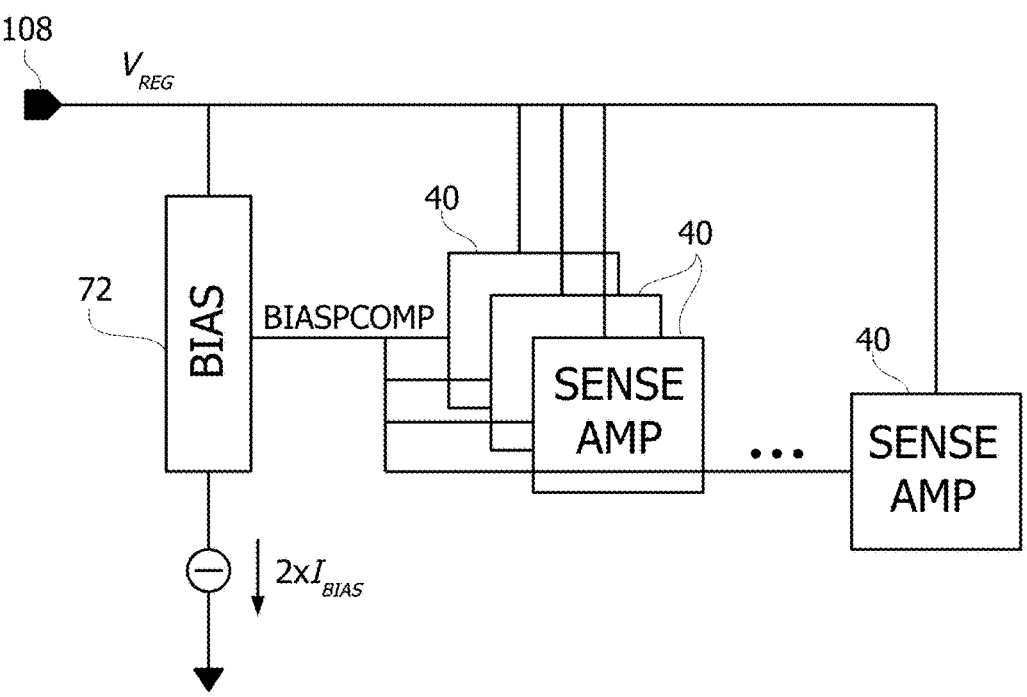
FIG. 7 is a circuit block diagram exemplary of a bank of sense amplifier circuits and related biasing circuitry.

FIG. 7 is a circuit block diagram exemplary of a bank of sense amplifier circuits 40 (e.g., one for each memory bank 10B of a memory 10) and a related biasing circuit 72 (e.g., a bias comparator buffer). In particular, the biasing circuit 72 is configured to receive the regulated voltage V$_{REG}$ from node 108 and produce the bias voltage BIASPCOMP for the floating comparators 42 of the sense amplifiers 40.

Figure 8:
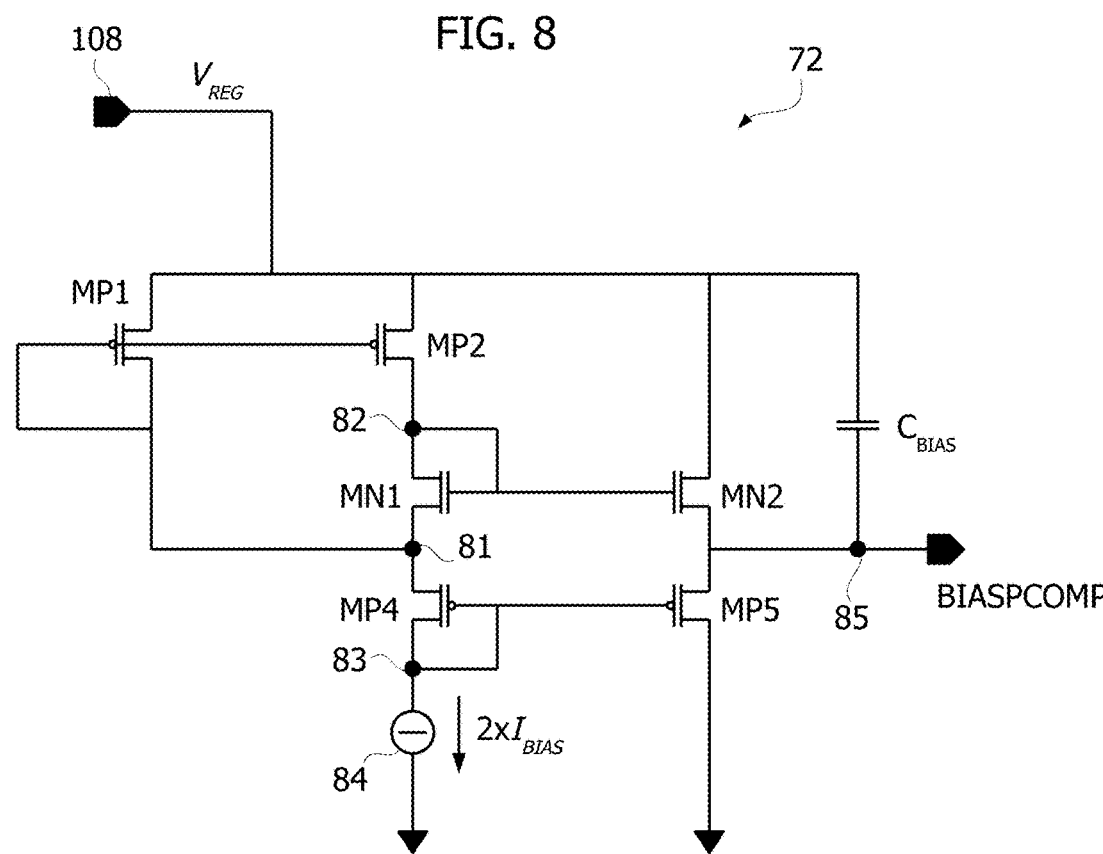
FIG. 8 is a circuit diagram exemplary of a biasing buffer circuit for use with sense amplifier circuits.

FIG. 8 is a circuit diagram exemplary of a possible implementation of the biasing circuit 72. Biasing circuit 72 includes a first current flow line arranged between the supply voltage node 108 and ground. The first current flow line includes a diode-connected p-channel MOS transistor MP1 having its conductive channel arranged between node 108 and a node 81 (e.g., transistor MP1 has a source terminal coupled to node 108, a drain terminal coupled to node 81, and a gate terminal coupled to its drain terminal). The first current flow line further includes a p-channel MOS transistor MP2 and a diode-connected n-channel MOS transistor MN1 having their conductive channels arranged in series between node 108 and node 81 (i.e., in parallel to the conductive channel of transistor MP1), where transistor MP2 is configured to receive the same gate control signal as transistor MP1 (e.g., transistor MP2 has a source terminal coupled to node 108, a drain terminal coupled to a node 82, and a gate terminal coupled to the gate terminal of transistor MP1; transistor MN1 has a drain terminal coupled to node 82, a source terminal coupled to node 81, and a gate terminal coupled to its drain terminal). The first current flow line further includes a diode-connected p-channel MOS transistor MP4 having its conductive channel arranged between node 81 and a node 83 to which a current generator 84 is coupled (e.g., transistor MP4 has a source terminal coupled to node 81, a drain terminal coupled to node 83, and a gate terminal coupled to its drain terminal). The first current flow line further includes the current generator 84 arranged between node 83 and ground, and configured to sink a current 2*I$_{BIAS}$ from node 83. Transistors MP1 and MP2 have the same size and receive the same control signal, so that the current 2*I$_{BIAS}$ is equally divided in the two upper branches of the first current flow line (i.e., a current I$_{BIAS}$ flows through transistor MP1 and the same current I$_{BIAS}$ flows through transistors MP2 and MN1). The biasing circuit 72 includes a second current flow line arranged between the supply voltage node 108 and ground. The second current flow line includes an n-channel MOS transistor MN2 having its conductive channel arranged between node 108 and an output node 85, where transistor MN2 is configured to receive the same gate control signal as transistor MN1 (e.g., transistor MN2 has a drain terminal coupled to node 108, a source terminal coupled to node 85, and a gate terminal coupled to the gate terminal of transistor MN1). The second current flow line further includes a p-channel MOS transistor MP5 having its conductive channel arranged between the output node 85 and ground, where transistor MP5 is configured to receive the same gate control signal as transistor MP4 (e.g., transistor MP5 has a source terminal coupled to node 85, a drain terminal coupled to ground, and a gate terminal coupled to the gate terminal of transistor MP4). Further, the biasing circuit 72 may include a capacitor C$_{BIAS}$ arranged between the supply node 108 and the output node 85.

Figure 9:
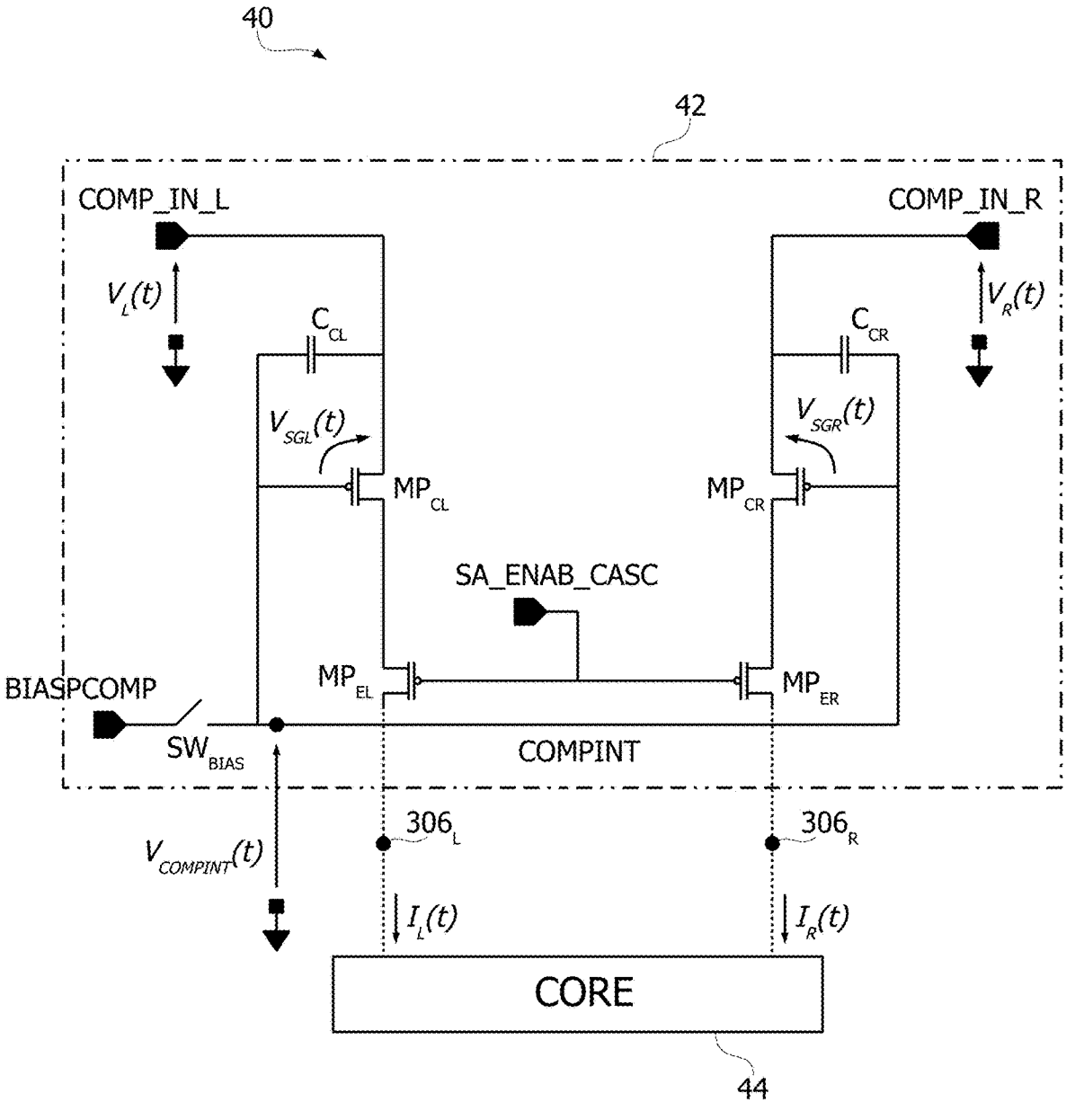
FIG. 9 is a circuit diagram exemplary of a floating comparator circuit for a sense amplifier circuit.

FIG. 9 is a circuit diagram exemplary of a floating comparator circuit 42 coupled to a sense amplifier core 44 in a sense amplifier circuit 40. It is noted that the comparator 42 and the SA core 44 operate at different voltage levels. In particular, the SA core 44 may operate at a low voltage (e.g., between ground voltage and V$_{DD}$, with V$_{DD}$ being in the range of 0.8 V to 0.9 V), while the comparator 42 operates at a higher voltage (e.g., between ground voltage and V$_{BL\_CHARGE}$, with V$_{BL\_CHARGE}$ being in the range of 1.7 V to 1.8 V). The sensing architecture of FIG. 9 thus aims at amplifying the differential input signal of comparator 42 (e.g., V$_L$(t)–V$_R$(t)) to produce an output differential current signal for the SA core 44, while using a differential input architecture. One or more embodiments as exemplified in FIG. 9 thus rely on a differential input pair having the input signals COMP_IN_L and COMP_IN_R applied to the source terminals of the input transistors (instead of being applied to their gate terminals).

In particular, the floating comparator 42 includes a low-voltage p-channel MOS transistor MP$_{CL}$ (e.g., the first input transistor) having a source terminal coupled to the first input terminal COMP_IN_L to receive voltage V$_L$(t), a gate terminal coupled to an internal biasing node COMPINT, and a drain terminal configured for coupling to the first input node 306$_L$ of SA core 44 (e.g., to produce a first output current I$_L$(t)). The floating comparator 42 includes a low-voltage p-channel MOS transistor MP$_{CR}$ (e.g., the second input transistor) having a source terminal coupled to the second input terminal COMP_IN_R to receive voltage V$_R$(t), a gate terminal coupled to the internal biasing node COMPINT, and a drain terminal configured for coupling to the second input node 306$_R$ of SA core 44 (e.g., to produce a second output current I$_R$(t)). Transistors MP$_{CL}$ and MP$_{CL}$ have the same size, and may have the same size as transistors MP1 and MP2 of the biasing circuit 72. As anticipated, the internal biasing node COMPINT is selectively couplable to the biasing voltage BIASPCOMP via switch SW$_{BIAS}$ controlled by signal SA_ENAB_BL.

Using a differential input pair where the input signals are received at the source terminals is advantageous insofar as it allows biasing the comparator 42 without using a charge pump (which would instead be required if the input signals were received at the gate terminals of the input transistors). However, since the input signals at the terminals COMP_IN_L and COMP_IN_R change over time between the instant when equalization is applied (before reading) and the instant when the input signals are sensed (during reading), the gate biasing of transistors MP$_{CL}$ and MP$_{CR}$ should not be kept at a fixed value (e.g., steadily connected to BIASPCOMP), otherwise the common mode compensation would not be maintained. For that reason, the gate terminals of transistors MP$_{CL}$ and MP$_{CR}$ are coupled to the biasing node BIASPCOMP before reading (e.g., during the equalization phase that precedes the discharge window DW) and are subsequently decoupled from the biasing node BIASPCOMP during reading (during the discharge window DW), so as to be "floating" during the reading phase. Since the gate terminals of transistors MP$_{CL}$ and MP$_{CR}$ are floating during operation of comparator 42, and considering a strong gate-source capacitive coupling of transistors MP$_{CL}$ and MP$_{CR}$ (e.g., considering that the parasitic capacitance C$_P$ between node COMPINT and ground is negligible compared to the gate-source capacitances of transistors MP$_{CL}$ and MP$_{CR}$), the biasing current of the differential input pair does not change even if the input signals V$_L$(t) and V$_R$(t) (also called YMS_LL and YMS_RR in FIG. 5) change during sensing, insofar as the voltage $V_{COMPINT}(t)$ at floating node COMPINT follows the variation of the common-mode input voltage.

In particular, if the capacitive coupling between node COMPINT and ground is negligible with respect to the capacitive coupling of node COMPINT with the input nodes COMP_IN_L and COMP_IN_R, the voltage $V_{COMPINT}(t)$ (between node COMPINT and ground) can be described according to the following equations (5) and (6):

$$V_{COMPINT}(0) = \frac{V_L(0) + V_R(0)}{2} - (V_{BL\_CHARGE} - V_{BIASPCOMP}) \quad (5)$$

$$V_{COMPINT}(t) = \frac{V_L(t) + V_R(t)}{2} - (V_{BL\_CHARGE} - V_{BIASPCOMP}) \quad (6)$$

where $V_{BL\_CHARGE}$ is the target value of the regulated voltage $V_{REG}$ and $V_{BIASPCOMP}$ IS the bias voltage at node BIASPCOMP (e.g., produced by biasing circuit 72).

Defining the following small signals:

$$V_{SGL}(t) \overset{\Delta}{=} v_{SGL}(t) + V_{SGL}(0), |v_{SGL}(t)| \ll |V_{SGL}(0)|, v_{SGL}(0) = 0$$

$$V_{SGR}(t) \overset{\Delta}{=} v_{SGR}(t) + V_{SGR}(0), |v_{SGR}(t)| \ll |V_{SGR}(0)|, v_{SGR}(0) = 0$$

$$V_L(t) \overset{\Delta}{=} v_L(t) + V_L(0), |v_L(t)| \ll |V_L(0)|, v_L(0) = 0$$

$$V_R(t) \overset{\Delta}{=} v_R(t) + V_R(0), |v_R(t)| \ll |V_{SR}(0)|, v_R(0) = 0$$

$$V_{COMPINT}(t) \overset{\Delta}{=} v_{COMPINT}(t) + V_{COMPINT}(0),$$
$$|v_{COMPINT}(t)| \ll |V_{COMPINT}(0)|, v_{COMPINT}(0) = 0$$

then $V_{COMPINT}(t)$, $I_L(t)$ and $I_R(t)$ can be expressed using previous equations (1) and (2) and following equation (7):

$$V_{COMPINT}(t) = \frac{v_L(t) + v_R(t)}{2} + V_{COMPINT}(0) \quad (7)$$

Using equations (6) and (7), the small signal voltage at node COMPINT can be expressed using the following equation (8):

$$v_{COMPINT}(t) = \frac{v_L(t) + v_R(t)}{2} \quad (8)$$

Assuming $g_m$ is the transconductance (current gain) of transistors $MP_{CL}$ and $MP_{CR}$ (supposed to be equal), and neglecting the body bias effect, then the output currents $I_L(t)$ and $I_R(t)$ can be expressed using the following equations (9) and (10):

$$I_L(t) = \frac{I_d(t)}{2} + I_{cm}(t) = g_m * v_{SGL}(t) + I_L(0) \quad (9)$$

$$I_R(t) = -\frac{I_d(t)}{2} + I_{cm}(t) = g_m * v_{SGR}(t) + I_R(0) \quad (10)$$

Using equations (9), (10), (3) and (4), the differential output current $I_d(t)$ and the common mode output current $I_{cm}(t)$ of comparator 42 can be expressed using the following equations (11) and (12):

$$I_d(t) = g_m * (v_{SGL}(t) - v_{SGR}(t)) + (I_L(0) - I_R(0)) = \quad (11)$$
$$g_m * (v_L(t) - v_R(t)) + (I_L(0) - I_R(0))$$

$$I_{cm}(t) = g_m * \frac{(v_{SGL}(t) + v_{SGR}(t))}{2} + \frac{(I_L(0) + I_R(0))}{2} = \quad (12)$$
$$g_m * \frac{(v_L(t) - v_{COMPINT}(t) + v_R(t) - v_{COMPINT}(t))}{2} + \frac{(I_L(0) + I_R(0))}{2} =$$
$$\frac{(I_L(0) + I_R(0))}{2} = \text{constant}$$

From equations (3), (4), (11) and (12), the common mode current $I_{cm}(t)$ is constant and defined at t=0 (during equalization, when node COMPINT is connected to the biasing voltage BIASPCOMP); the output currents $I_L(t)$ and $I_R(t)$ thus both depend on the difference $v_L(t)-v_R(t)$ for t>0 (during reading) and on a constant component at t=0 (during equalization):

$$I_L(t) = \frac{1}{2}g_m * (v_L(t) - v_R(t)) + I_L(0) \quad (13)$$

$$I_R(t) = -\frac{1}{2}g_m * (v_L(t) - v_R(t)) + I_R(0) \quad (14)$$

Therefore, using a floating comparator as discussed with reference to FIG. 9, the offset compensation carried out at t=0 (before sensing) remains valid for t>0 (during sensing), and the floating comparator 42 amplifies the differential input voltage $v_L(t)-v_R(t)$.

In one or more embodiments, strong gate-source capacitive coupling of transistors $MP_{CL}$ and $MP_{CR}$ may be achieved by proper design of the transistors themselves. Additionally, or alternatively, the floating comparator 42 may include a capacitor $C_{CL}$ coupled between the gate and source terminals of transistor $MP_{CL}$, and a capacitor $C_{CR}$ coupled between the gate and source terminals of transistor $MP_{CR}$, to increase (e.g., strengthen) the capacitive coupling therebetween. Capacitors $C_{CL}$ and $C_{CR}$ may have the same capacitance.

Additionally, the floating comparator 42 may include a low-voltage p-channel MOS transistor $MP_{EL}$ (e.g., a first cascode transistor) having its conductive channel arranged in series with the conductive channel of transistor $MP_{CL}$, and configured to receive the cascode enable signal SA_ENAB_CASC at its gate terminal. In particular, transistor $MP_{EL}$ may have a source terminal coupled to the drain terminal of transistor $MP_{CL}$, a gate terminal coupled to cascode control node SA_ENAB_CASC, and a drain terminal configured for coupling to the first input node $306_L$ of SA core 44 (e.g., to provide the first output current $I_L(t)$). The floating comparator 42 may include a low-voltage p-channel MOS transistor $MP_{ER}$ (e.g., a second cascode transistor) having its conductive channel arranged in series with the conductive channel of transistor $MP_{CR}$, and configured to receive the cascode enable signal SA_ENAB_CASC at its gate terminal. In particular, transistor $MP_{ER}$ may have a source terminal coupled to the drain terminal of transistor $MP_{CR}$, a gate terminal coupled to cascode control node SA_ENAB_CASC, and a drain terminal configured for coupling to the second input node $306_R$ of SA core 44 (e.g., to provide the second output current $I_R(t)$). Cascode transistors $MP_{CL}$ and $MP_{CL}$ may be used to cut off the current flowing through comparator 42 when the sense amplifier 40 is turned off.

Figure 10:
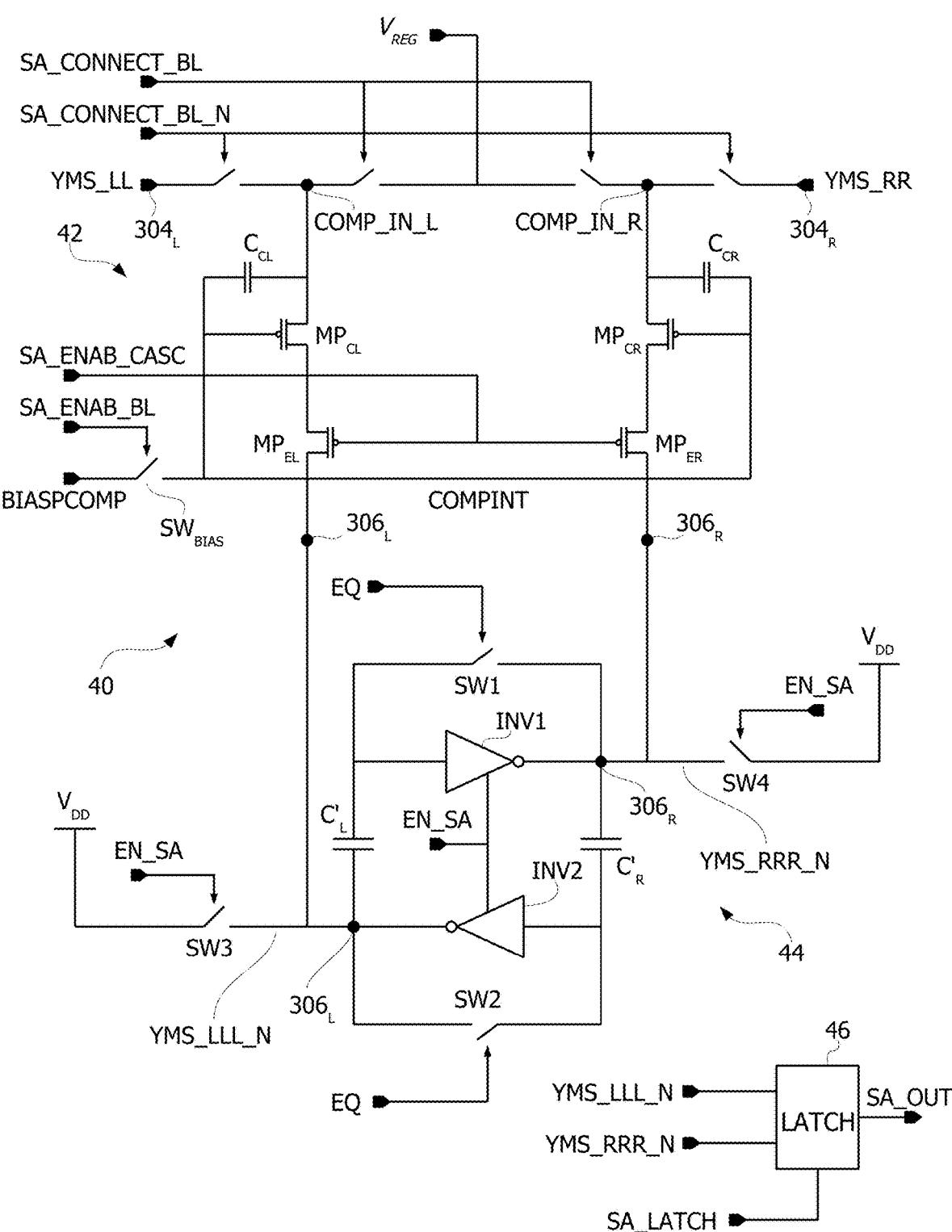
FIG. 10 is a circuit diagram exemplary of a sense amplifier circuit.

FIG. 10 is a circuit block diagram that shows a detailed implementation of the reading architecture of FIG. 4, where the sense amplifier circuit 40 includes the floating comparator 42 of FIG. 9 and a sense amplifier core 44 as exemplified in FIG. 6. Additionally with respect to the SA core of FIG. 6, in the SA core 44 of the architecture of FIG. 10 the nodes $306_L$ and $306_R$ are selectively couplable to the supply voltage $V_{DD}$, e.g., via respective switches SW3 and SW4 controlled by signal EN_SA. Additionally, the SA core 44 of FIG. 10 includes a latch circuit 46 controlled by signal SA_LATCH that provides as output the sensed value SA_OUT as a function of signals YMS_LLL_N and YMS_RRR_N.

It is also noted that in the SA core 44 of the architecture of FIG. 10 the capacitors are arranged differently than in the SA core 30 of the architecture of FIG. 3. In particular, a first capacitor C'L is arranged between node $306_L$ and the input terminal of inverter INV1, and a second capacitor C'R is arranged between node $306_R$ and the input terminal of inverter INV2. The output terminal of inverter INV1 is directly connected to node $306_R$ and the output terminal of inverter INV2 is directly connected to node $306_L$. This is coherent with the fact that the differential signal received by the SA core 44 is a differential current generated by the comparator 42, which converts a differential voltage in a differential current. The two components of the differential current are injected in the output terminals of the two inverters INV1 and INV2 (where there is an equilibrium current due to the previous compensation). Such a current injection results in the latch moving from its equilibrium status.

Read operation using the reading architecture of FIG. 10 may thus be carried out according to the procedure described in the following, where the pre-charge procedure is carried out substantially as discussed with reference to the architecture of FIG. 3.

In a first step, the main bit lines (e.g., all nodes $300_L$ and $300_R$—see FIG. 3) are connected to the supply voltage rail 108 and charged by voltage $V_{REG}$ to the target value $V_{BL}$ CHARGE (e.g., about 1.7 V). The word line signal WL applied to the word line 103W is also driven to the value $V_{BL\_CHARGE}$. Additionally, signals YN<i>, YN<i+1>, . . . are set so as to connect one of nodes $300_L$ of the left group and the corresponding (e.g., homologous, symmetrical) node $300_R$ of the right group to the sensing nodes $302_L$ and $302_R$, respectively, thereby selecting the main bit lines for reading. Additionally, sensing node $302_L$ is connected to the input node $304_L$ of the sense amplifier 40 by closing switch $SW_{YMPS,L}$, and sensing node $302_R$ is connected to the input node $304_R$ of the sense amplifier 40 by closing switch $SW_{YMPS,R}$. Additionally, signal SA_ENAB_BL is asserted (low), so that the biasing node COMPINT of comparator 42 is initialized to the biasing value BIASPCOMP provided by the biasing circuit 72. The remaining switches are open during the first phase, that is: all nodes 300 that do not correspond to a selected main bit line are decoupled from the respective sensing node 302, all the bit lines are decoupled from the respective node 300 (at this stage), and switches SW1 and SW2 of the sense amplifier core 44 are open as well. During this first phase, the sense amplifier 44 is off (inactive).

In a second step, switches SW1 and SW2 are closed (equalization signal EQ is asserted). In this phase, input offset of the sense amplifier core 44 is compensated.

In a third step, a selected bit line pertaining to the left group and to the selected main bit line (i.e., the left main bit line that is currently connected to node $302_L$) is connected to the corresponding main bit line (e.g., node $300_L$) by closing the respective switch via signal NYO<j>. Similarly, the corresponding selected bit line pertaining to the right group and to the selected main bit line (i.e., the right main bit line that is currently connected to node $302_R$) is connected to the corresponding main bit line (e.g., node $300_R$) by closing the respective switch via signal NYO<j>. By doing so, the selected bit lines are pre-charged, i.e., the respective capacitances CBL are charged from voltage $V_{BE}$ (e.g., about 0.6 V) to the target voltage $V_{BL\_CHARGE}$.

During these three initial steps, signal SA_CONNECT_BL is asserted to close the corresponding switches and its complement SA_CONNECT_BL_N is de-asserted to open the corresponding switches, so that the internal nodes COMP_IN_L and COMP_IN_R of comparator 42 are shorted between themselves and isolated from the input nodes $304_L$ and $304_R$. Also, signal EN_SA is low so that switches SW3 and SW4 are closed and inverters INV1 and INV2 are disabled. Signal SA_LATCH is low so that latch 46 is disabled.

In a fourth step, the selected main bit lines (left and right) are disconnected from the supply voltage node 108 by opening the respective switches controlled by signals NYN<i>. At the same time, signal SA_ENAB_BL switches to a de-asserted (high, e.g., equal to $V_{BL\_CHARGE}$) state, so that switch $SW_{BIAS}$ opens and node COMPINT is isolated from biasing BIASPCOMP (i.e., it floats).

In a fifth step, signal EN_SA switches to a high value ($V_{DD}$, e.g., 0.9 V) so as to open switches SW3 and SW4 and enable inverters INV1 and INV2. At the same time, signal SA_ENAB_CASCODE switches from value $V_{BL\_CHARGE}$ (e.g., about 1.7 V) to value $V_{BL\_CHARGE}-V_{DD}$ (e.g., about (1.7-0.9) V=0.8 V). During this phase, node COMPINT is floating and equalization is carried out. In particular, offset compensation of comparator 42 starts with currents $I_L(0)$ and $I_R(0)$ flowing respectively from nodes $306_L$ and $306_R$ to the inputs of the SA core 44, and with the comparator inputs shorted to $V_{REG}$ (at value $V_{BL\_CHARGE}$).

In a sixth step, the word line signal WL applied to a certain word line 103W is driven to ground voltage, thereby activating the selection transistors 104 and performing the actual word line selection (i.e., selection of two specific memory cells $102_L$ and $102_R$). As a result, capacitive nodes $300_L$ and $300_R$ (e.g., the bit line capacitances CBL and the main bit line capacitances $C_{MAIN}$) start discharging and the voltage at nodes $300_L$ and $300_R$ drops during the discharge window. At this stage, signal SA_CONNECT_BL switches to a de-asserted state (e.g., high, equal to $V_{BL\_CHARGE}$) to open the corresponding switches and its complement SA_CONNECT_BL_N switches to an asserted state (e.g., low) to close the corresponding switches, so that the internal nodes COMP_IN_L and COMP_IN_R of comparator 42 are disconnected from voltage $V_{REG}$ and are coupled, respectively, to the input nodes $304_L$ and $304_R$ to receive, respectively, signals YMS_LL and YMS_RR. At this stage, currents $I_L(t1)$ and $I_R(t1)$ flow respectively from nodes $306_L$ and $306_R$ to the inputs of the SA core 44. Subsequently, equalization signal EQ switches to a de-asserted state (e.g., low) so as to open switches SW1 and SW2 and carry out the sensing operation.

In a seventh step, after the equalization signal EQ switches to a de-asserted state, a differential signal builds up as the difference between signals YMS_LLL_N and YMS_RRR_N, which is received by latch 46. Once signals YMS_LLL_N and YMS_RRR_N have commutated, signal SA_LATCH is asserted (e.g., high, equal to $V_{DD}$) and the reading output value is provided as signal SA_OUT.

A reading architecture as exemplified in FIG. 10 may thus rely on the provision of a floating comparator 42 without using input capacitors (e.g., $C_{INL}$ and $C_{INR}$ in FIG. 3).

One or more embodiments as exemplified herein may thus provide a higher sensing speed compared to conventional solutions. Such a higher sensing speed may be due, at least in part, to a relevant shortening of the discharge window (e.g., down to about 1 ns compared to about 4 ns of the former solutions). Shortening of the discharge window may be obtained since the comparator stage amplifies the differential signal, and thus allows sensing at a reduced differential input voltage, and since there are no input capacitors to be charged, which allows speeding-up the equalization step. Further, the higher sensing speed may be due, at least in part, to the speeding-up of the commutation of the sense amplifier core, which is also allowed by the removal of the input capacitors. For instance, one or more embodiments may exhibit a memory access time in the range of about 3.8 ns to 3.9 ns (from the moment when a bit line is connected to its respective main bit line, to the moment when the reading output value SA_OUT is available at the output of latch 46), with a supply voltage $V_{DD}$ in the range of about 0.75 V to 1.05 V and a temperature in the range of –40° C. to 140° C.

Another advantage of one or more embodiments is a high sensing accuracy despite the shortening of the discharge window, which is facilitated by the fact that the comparator offset is compensated together with equalization of the sense amplifier core.

Another advantage of one or more embodiments is a lower power consumption with respect to conventional solutions, which is due to the reduced DC current consumption that comes with the shortening of the equalization window. For instance, one or more embodiments may exhibit a current consumption of about 0.391 µA/MHz per each sense amplifier, while former solutions may exhibit a current consumption of about 0.52 µA/MHz per each sense amplifier.

Without prejudice to the underlying principles, the details and embodiments may vary, even significantly, with respect to what has been described by way of example, without departing from the extent of protection.

The claims are an integral part of the technical teaching provided herein in respect of the embodiments.

The extent of protection is determined by the annexed claims.

The invention claimed is:

1. A sense amplifier circuit for a memory device, comprising:

a first input terminal and a second input terminal configured for coupling to a first memory sensing node and a second memory sensing node, respectively;

a comparator circuit comprising:

a first input node and a second input node;

a first output node and a second output node configured to produce a first output current and a second output current, respectively;

a first input transistor having a conductive channel arranged between said first input node and said first output node of the comparator circuit, and a first control terminal coupled to an internal biasing node;

a second input transistor having a conductive channel arranged between said second input node and said second output node of the comparator circuit, and a second control terminal coupled to said internal biasing node;

wherein said first input node and said second input node of the comparator circuit are selectively couplable to each other in response to assertion of a compensation signal, and selectively couplable to said first and second input terminals, respectively, in response to de-assertion of said compensation signal;

wherein said internal biasing node is selectively couplable to a comparator biasing node in response to assertion of a bias enable signal, and selectively left floating in response to de-assertion of said bias enable signal;

a sensing circuit coupled to said first output node and to said second output node of the comparator circuit, said sensing circuit configured to produce a memory reading signal as a function of a difference between said first output current and said second output current.

2. The sense amplifier circuit of claim 1, wherein said first input transistor comprises a p-channel MOS transistor having a source terminal coupled to said first input node and a drain terminal configured for coupling to said first output node, and said second input transistor comprises a p-channel MOS transistor having a source terminal coupled to said second input node and a drain terminal configured for coupling to said second output node.

3. The sense amplifier circuit of claim 1, wherein said first input transistor and said second input transistor have a same size.

4. The sense amplifier circuit of claim 1, wherein a capacitive coupling between said internal biasing node and ground is negligible with respect to a capacitive coupling between said internal biasing node and said first and second input nodes of the comparator circuit.

5. The sense amplifier circuit of claim 1, wherein a capacitance between said internal biasing node and ground is at least ten times lower than a capacitance between said internal biasing node and said first and second input nodes of the comparator circuit.

6. The sense amplifier circuit of claim 1, wherein a capacitance between said internal biasing node and ground is at least twenty times lower than a capacitance between said internal biasing node and said first and second input nodes of the comparator circuit.

7. The sense amplifier circuit of claim 1, wherein a capacitance between said internal biasing node and ground is at least fifty times lower than a capacitance between said internal biasing node and said first and second input nodes of the comparator circuit.

8. The sense amplifier circuit of claim 1, wherein a capacitance between said internal biasing node and ground is at least one hundred times lower than a capacitance between said internal biasing node and said first and second input nodes of the comparator circuit.

9. The sense amplifier circuit of claim 1, wherein said comparator circuit comprises a first capacitor arranged between said internal biasing node and said first input node, and a second capacitor arranged between said internal biasing node and said second input node.

10. The sense amplifier circuit of claim 1, wherein said comparator circuit comprises:

a first cascode transistor having a conductive channel arranged in series with the conductive channel of said first input transistor, and a control terminal configured to receive a cascode enable signal; and a second cascode transistor having a conductive channel arranged in series with the conductive channel of said second input transistor, and a control terminal configured to receive said cascode enable signal.

11. The sense amplifier circuit of claim 1, wherein said first input node and said second input node of the comparator circuit are further selectively couplable to a regulated supply node that provides a regulated supply voltage in response to assertion of said compensation signal.

12. The sense amplifier circuit of claim 1, wherein said sensing circuit comprises:

a first capacitor having a first terminal coupled to said first output node;

a first inverter having an input terminal coupled to a second terminal of said first capacitor and an output terminal coupled to said second output node;

a second capacitor having a first terminal coupled to said second output node;

a second inverter having an input terminal coupled to a second terminal of said second capacitor and an output terminal coupled to said first output node; and a latch circuit configured to sense a differential voltage between said first and second output nodes and produce a digital sensing signal as a function thereof in response to assertion of a latch enable signal.

13. A memory device, comprising:

a plurality of memory banks;

wherein:

each memory bank is coupled to a respective sense amplifier circuit according to claim 1; and each memory bank comprises an array of memory cells arranged in a plurality of bit lines and a plurality of word lines, wherein each memory cell is arranged in series to a respective selection transistor between a ground terminal and a corresponding bit line of the plurality of bit lines, and wherein each bit line of the plurality of bit lines is couplable to: a regulated supply node that provides a regulated supply voltage or one of said first and second memory sensing nodes.

14. The memory device of claim 13, further comprising a biasing circuit coupled to said regulated supply node and configured to produce a comparator biasing voltage at said comparator biasing node.

15. The memory device of claim 14, wherein the biasing circuit comprises a first current flow line arranged between said regulated supply node and ground, the first current flow line comprising:

a first diode-connected transistor having a conductive channel arranged between said regulated supply node and an internal node;

a second transistor and a third diode-connected transistor having their conductive channels arranged in series between said regulated supply node and said internal node, wherein said second transistor has a same size as said first diode-connected transistor and is configured to receive a same control signal as said first diode-connected transistor;

a fourth diode-connected transistor having a conductive channel arranged between said internal node and a further internal node; and a current generator arranged between said further internal node and ground, and configured to sink a current from said further internal node;

wherein the biasing circuit comprises a second current flow line arranged between said regulated supply node and ground, the second current flow line comprising:

a fifth transistor having a conductive channel arranged between said regulated supply node and said comparator biasing node, wherein said fifth transistor is configured to receive the same control signal as said third diode-connected transistor; and a sixth transistor having a conductive channel arranged between said comparator biasing node and ground, wherein said sixth transistor is configured to receive the same control signal as said fourth diode-connected transistor;

wherein the biasing circuit preferably comprises a capacitor arranged between said regulated supply node and said comparator biasing node.

16. The memory device of claim 15, wherein said first diode-connected transistor and said second transistor have a same size as said first input transistor and said second input transistor of the comparator circuit.

17. The memory device of claim 15, further comprising an operating mode configured to:

i) assert the bias enable signal to couple said internal biasing node of said comparator circuit to said comparator biasing node, and assert said compensation signal to couple said first input node and said second input node to each other;

ii) couple at least one pair of selected bit lines to said regulated supply node to pre-charge said selected bit lines to a target voltage;

iii) upon expiration of said pre-charge of said pair of selected bit lines: decouple said pair of selected bit lines from said regulated supply node; couple said pair of selected bit lines to said first and second memory sensing nodes, respectively; de-assert said bias enable signal to make said internal biasing node of said comparator circuit float; and enable and equalize said sensing circuit;

iv) upon expiration of an equalization interval, de-assert said compensation signal to couple said first input node and said second input node to said first input terminal and to said second input terminal, respectively, and activate said sensing circuit; and v) upon expiration of a sensing interval, produce said memory reading signal.

* * * * *